(12) United States Patent
Gebara et al.

(10) Patent No.: US 8,111,090 B2
(45) Date of Patent: *Feb. 7, 2012

(54) VOLTAGE COMPARATOR HAVING IMPROVED KICKBACK AND JITTER CHARACTERISTICS

(75) Inventors: Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 393 days.

This patent is subject to a terminal disclaimer.

(21) Appl. No.: 12/358,547

(22) Filed: Jan. 23, 2009

(65) Prior Publication Data

US 2009/0153196 A1 Jun. 18, 2009

Related U.S. Application Data

(63) Continuation of application No. 11/464,672, filed on Aug. 15, 2006, now Pat. No. 7,570,082.

(51) Int. Cl.
*H03K 5/22* (2006.01)

(52) U.S. Cl. ............... 327/65; 327/55; 327/57; 327/67

(58) Field of Classification Search ............ 327/55, 327/57, 63, 65, 67
See application file for complete search history.

(56) References Cited

U.S. PATENT DOCUMENTS

| | | | |
|---|---|---|---|
| 4,803,382 A | 2/1989 | Tanimoto et al. | |
| 5,285,115 A | 2/1994 | Tsuji | |
| 5,563,598 A | 10/1996 | Hickling | |
| 5,589,785 A | 12/1996 | Garavan | |
| 5,600,275 A | 2/1997 | Garavan | |
| 5,696,726 A | 12/1997 | Tsukikawa | |
| 6,157,220 A | 12/2000 | Broekaert | |
| 6,184,721 B1 | 2/2001 | Krymski | |
| 6,396,329 B1 | 5/2002 | Zerbe | |
| 6,400,219 B1 | 6/2002 | Fayed | |
| 6,404,373 B1 | 6/2002 | Yu et al. | |
| 6,404,374 B1 | 6/2002 | Yu et al. | |
| 6,617,885 B2 | 9/2003 | Lim et al. | |
| 6,801,059 B2 | 10/2004 | Lee | |
| 6,946,882 B2 | 9/2005 | Gogl et al. | |

(Continued)

OTHER PUBLICATIONS

G.M. Yin et al.; "A High-Speed CMOS Comparator with 8-b Resolution," IEEE Journal of Solid-State Circuits, Vo. 27, No. 2, Feb. 1992, pp. 208-211.

*Primary Examiner* — Long Nguyen
(74) *Attorney, Agent, or Firm* — Cantor Colburn LLP; Libby Toub

(57) ABSTRACT

A comparator apparatus for comparing a first and a second voltage input includes a pair of cross-coupled inverter devices, including a pull up device and a pull down device, with output nodes defined between the pull up and pull down devices. A first switching device is coupled to the first input and a second switching device is coupled to the second input, with control circuitry configured for selective switching between a reset mode and a compare mode. In the reset mode, the first and second voltage inputs are coupled to respective output nodes so as to develop a differential signal thereacross, and the pull down devices in each inverter are isolated from the pull up devices. In the compare mode, the voltage inputs are isolated from the output nodes, and the pull down devices in each inverter are coupled to the pull up devices to latch the output nodes.

2 Claims, 4 Drawing Sheets

U.S. PATENT DOCUMENTS

| | | |
|---|---|---|
| 6,967,505 B2 * | 11/2005 | Watarai ............................ 327/55 |
| 6,967,506 B2 | 11/2005 | Roger |
| 6,985,101 B2 | 1/2006 | Leung et al. |
| 7,570,082 B2 * | 8/2009 | Gebara et al. ................... 327/63 |
| 2005/0151566 A1 | 7/2005 | Jaussi et al. |

* cited by examiner

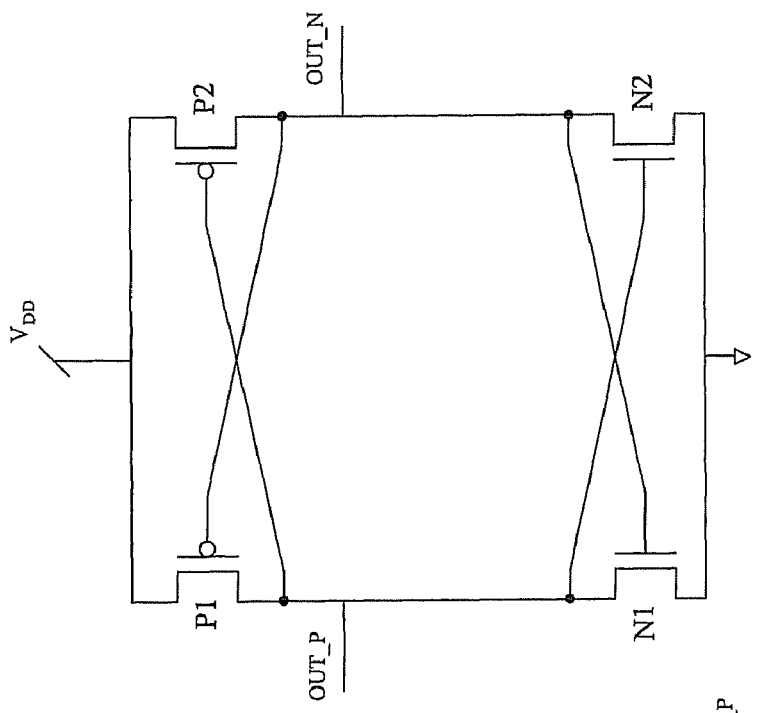
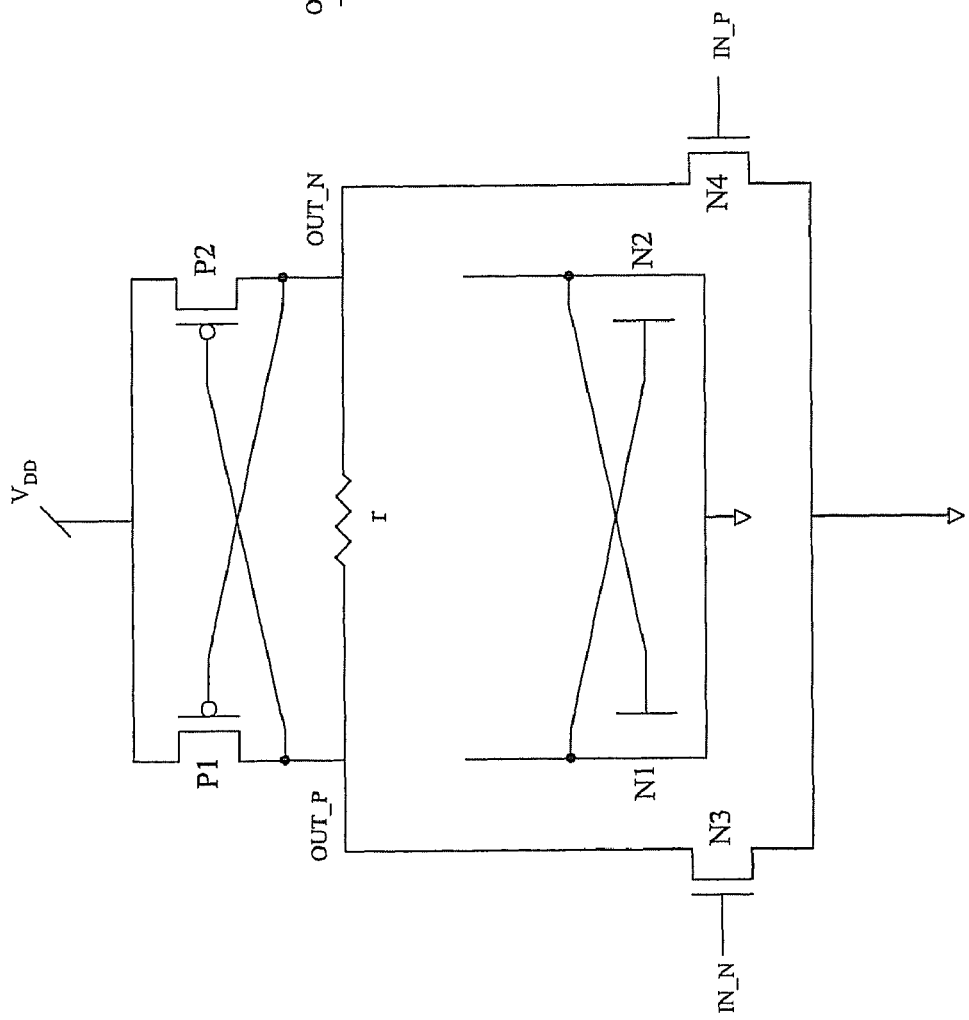
Fig. 4(a)
Fig. 4(b)

VOLTAGE COMPARATOR HAVING IMPROVED KICKBACK AND JITTER CHARACTERISTICS

CROSS-REFERENCE TO RELATED APPLICATION

This application is a continuation of U.S. patent application Ser. No. 11/464,672, filed Aug. 15, 2006, the disclosure of which is incorporated by reference herein in its entirety.

STATEMENT OF GOVERNMENT INTEREST

This invention was made with U.S. Government support under Contract No. NBCH 3039004 awarded by the Defense Advanced Research Projects Agency (DARPA). The Government has certain rights in this invention.

BACKGROUND

The present invention relates generally to voltage comparator circuits in integrated circuits and, more particularly, to a voltage comparator apparatus and method having improved kickback and jitter characteristics.

Comparators are widely used in integrated circuits that include, for example, analog-to-digital converters and voltage signal receivers on interconnections and clock distribution lines. A voltage comparator circuit provides an indication of which of two input voltages is larger or smaller. Since a voltage comparator often senses small differences between the input voltages and generates a digital output, a large amplification may be needed. The large amplification necessary for sensing small differences may be constructed using a differential amplifier operating in a non-linear region. The differential amplifier has two transistors connected as a source-coupled pair with one of the transistors turned off and the other transistor turned on. Therefore, the amplifier has one transistor turned on even under a static condition when the transistors are in a stable non-switching state.

As amplification circuits, comparators are susceptible to influence of noise on the input voltages. The noise on the input voltages causes erratic switching and false triggering of the comparator output. Thus, positive feedback can be applied to decrease the decision time limiting the effects of the noise on the inputs.

In one type of conventional CMOS voltage comparator, cross-coupled inverters are used to latch the state of a pair of input voltages applied to opposing legs of the latch. During a reset phase of the comparator, both the output voltage nodes are biased through control switching to a stable state (e.g., at the supply voltage), and are also isolated from the ground terminal of the device so as to prevent static power dissipation. When the input voltages are to be compared during the compare phase, a strobe (clock) signal deactivates the bias control circuitry, and couples the inverters/output nodes to the input voltages. The input voltage having the higher value will cause the transistor associated therewith to conduct more strongly, thus pulling the corresponding output node down more quickly, and in turn latching the output voltages to the complementary rail values.

However, one disadvantage associated with CMOS comparators that have their inputs active during the compare phase is coupling of the output voltages to the input nodes. In particular, the kickback caused by the output voltage nodes when transitioning from the metastable state can in turn cause jitter on the input voltages. Unfortunately, when attempting to amplify a small input voltage differential, it is possible that the resulting jitter on the input signals can actually cause the comparator to latch the incorrect state. As result, the overall performance of the comparator is diminished, in terms of resolution (i.e., the accuracy of the comparator, in bits, given a regeneration time) and in terms of offset (i.e., the magnitude of applied input voltage differential, below which results in an indeterminate output decision).

Accordingly, it would be desirable to be able to provide a voltage comparator with improved immunity to output kickback and jitter on the input voltage signals.

SUMMARY

The foregoing discussed drawbacks and deficiencies of the prior art are overcome or alleviated by a comparator apparatus for comparing a first and a second voltage input. In an exemplary embodiment, the apparatus includes a pair of cross-coupled inverter devices, each of which includes a pull up device and a pull down device, with corresponding output nodes defined between the pull up and pull down devices of each inverter. A first switching device is coupled to the first voltage input and a second switching device is coupled to the second voltage input, with control circuitry configured for selective switching between a reset mode and a compare mode of operation. In the reset mode of operation, the first and second voltage inputs are coupled to respective output nodes so as to develop a differential signal across the output nodes, and the pull down devices in each inverter are isolated from the respective pull up devices. In the compare mode of operation, the first and second voltage inputs are isolated from respective output nodes, and the pull down devices in each inverter are coupled to the respective pull up devices so as to allow latching of the output nodes to a corresponding full rail value.

In another embodiment, a method for comparing a first voltage input and a second voltage input includes coupling, during a reset mode, the first and second voltage inputs to a corresponding pair of output nodes of a comparator device, the output nodes defined between corresponding pull up and pull down devices of a pair of cross-coupled inverter devices; isolating, during the reset mode, the pull down devices of the inverter devices from the pull up devices so as to develop a differential signal across the output nodes; isolating, during a compare mode, the first and second voltage inputs from the output nodes; and recoupling, during the compare mode, the pull down devices of the inverter devices to the pull up devices so as to allow latching of the output nodes to a corresponding full rail value.

TECHNICAL EFFECTS

As a result of the summarized invention, a solution is technically achieved in which a voltage comparator is configured so as to isolate the voltage input signals from the output stage during a compare phase of the circuit, thereby improving the kickback and jitter characteristics of the device.

BRIEF DESCRIPTION OF THE DRAWINGS

Referring to the exemplary drawings wherein like elements are numbered alike in the several Figures:

FIG. 4(a) is a schematic diagram of the equivalent circuit of the voltage comparator of FIG. 3 while operating in a reset mode;

FIG. 4(b) is a schematic diagram of the equivalent circuit of the voltage comparator of FIG. 3 while operating in a compare mode.

DETAILED DESCRIPTION

Disclosed herein is a voltage apparatus and method having improved kickback and jitter characteristics. Briefly stated, the present invention embodiments are configured so as to isolate the voltage input signals from the output stage during the compare phase of the circuit. Instead, the control circuitry couples the voltage input signals to the output stage so as to generate a small differential thereon during the reset phase of the circuit. Simultaneously during the reset phase, the NFET devices of the cross-coupled inverters are isolated from the associated PFET devices, thus isolating the NFET devices from the output nodes. Such as configuration, as described more fully below, substantially improves kickback and jitter for a voltage comparator device.

Figure 1:
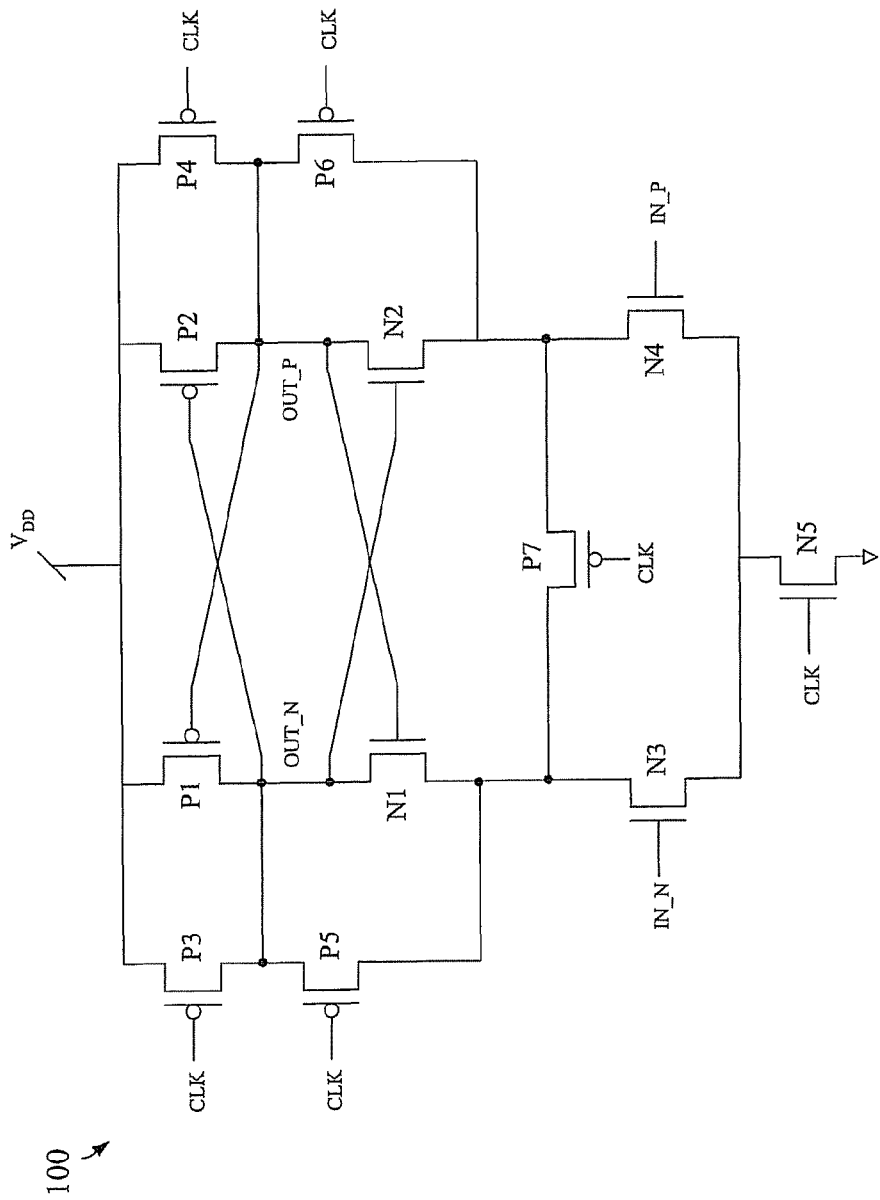
FIG. 1 is a schematic diagram of an existing dynamic voltage comparator circuit.

Referring initially to FIG. 1, there is shown a schematic diagram of an existing dynamic voltage comparator circuit 100. The circuit 100 features a pair of cross-coupled inverters, including PFETs P1 and P2, along with NFETs N1 and N2. A first output node OUT_N is defined between P1 and P2, while a second output node OUT_P is defined between P2 and N2, on opposing legs of the inverters. The input voltages (IN_N, IN_P) to be compared with one another are respectively coupled to the gates of NFETs N3 and N4. A small differential between the voltages on IN_N and IN_P is (during a compare phase) latched by the cross-coupled inverters to a full rail voltage at the output nodes OUT_N and OUT_P.

As further shown in FIG. 1, control devices for the comparator circuit 100 include PFETs P3, P4, P5, P6 and P7, in addition to NFET N5. The control devices are operated by a uniphase clock signal CLK (i.e., uniphase in that the logical complement signal is not needed for operation of the comparator).

Figure 2B:
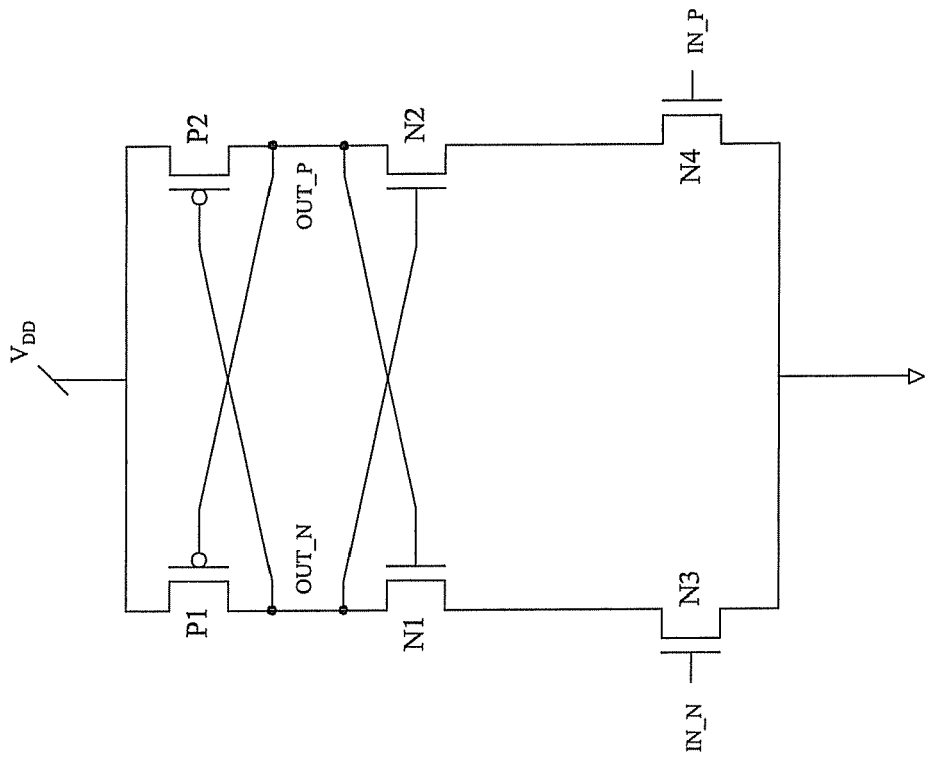
FIG. 2(b) is a schematic diagram of the equivalent circuit of the voltage comparator of FIG. 1 while operating in a compare mode.
Figure 2A:
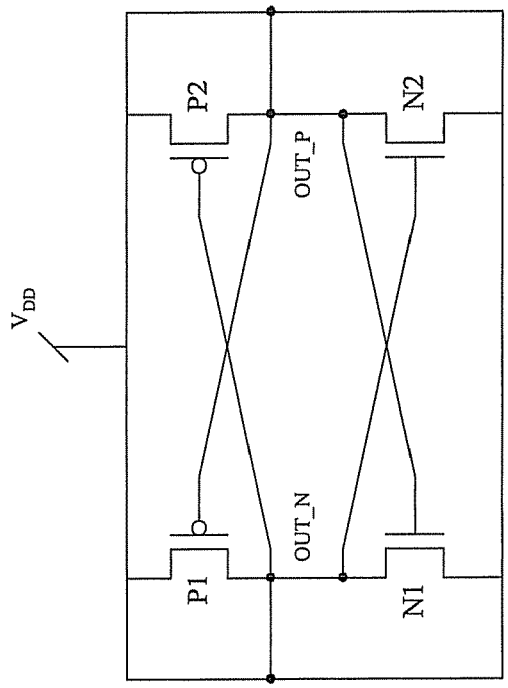
FIG. 2(a) is a schematic diagram of the equivalent circuit of the voltage comparator of FIG. 1 while operating in a reset mode.

FIGS. 2(a) and 2(b) illustrate the operation of comparator circuit 100 in further detail. In the reset mode of operation, the control signal CLK is logical low, thereby resulting in the equivalent circuit depicted in FIG. 2(a). That is, PFETs P3, P4, P5, P6 and P7 are active low to effectively set each point within the cross-coupled inverters to a stable state corresponding to the supply rail voltage ($V_{DD}$). Since NFET N5 is non-conducting when CLK is low (FIG. 1), the output nodes are also isolated from ground. This also prevents power from being dissipated in the static mode, as current is prevented from flowing through either of the legs of the comparator circuit.

Then, during a desired compare operation of the voltages at IN_N and IN_P, the clock signal CLK is strobed high to result in the equivalent circuit shown in FIG. 2(b). As shown, each of the control PFET devices P3 through P7 are deactivated by the logic high value of CLK, while control NFET device N5 is activated to provide a ground path for the output nodes OUT_N, OUT_P. Whichever of the input voltages IN_N, IN_P is higher with respect to the other will result in the corresponding NFET (N3, N4) to conduct more strongly than the other. In turn, one of the output nodes OUT_N. OUT_P will begin to discharge faster than the other, ultimately causing one of the output node to latch to ground and the other to latch at the rail voltage $V_{DD}$.

As indicated above, however, the input voltages IN_N and IN_P (applied to the gates of NFETs N3 and N4) are capacitively coupled to the output nodes during the compare operation in FIG. 2(b). Where the difference between the voltages at IN_N and IN_P is relatively small, the kickback of the changing voltages of OUT_N and OUT_P can possibly affect the values IN_N and IN_P to the extent that an incorrect state is ultimately latched at the output nodes.

Figure 3:
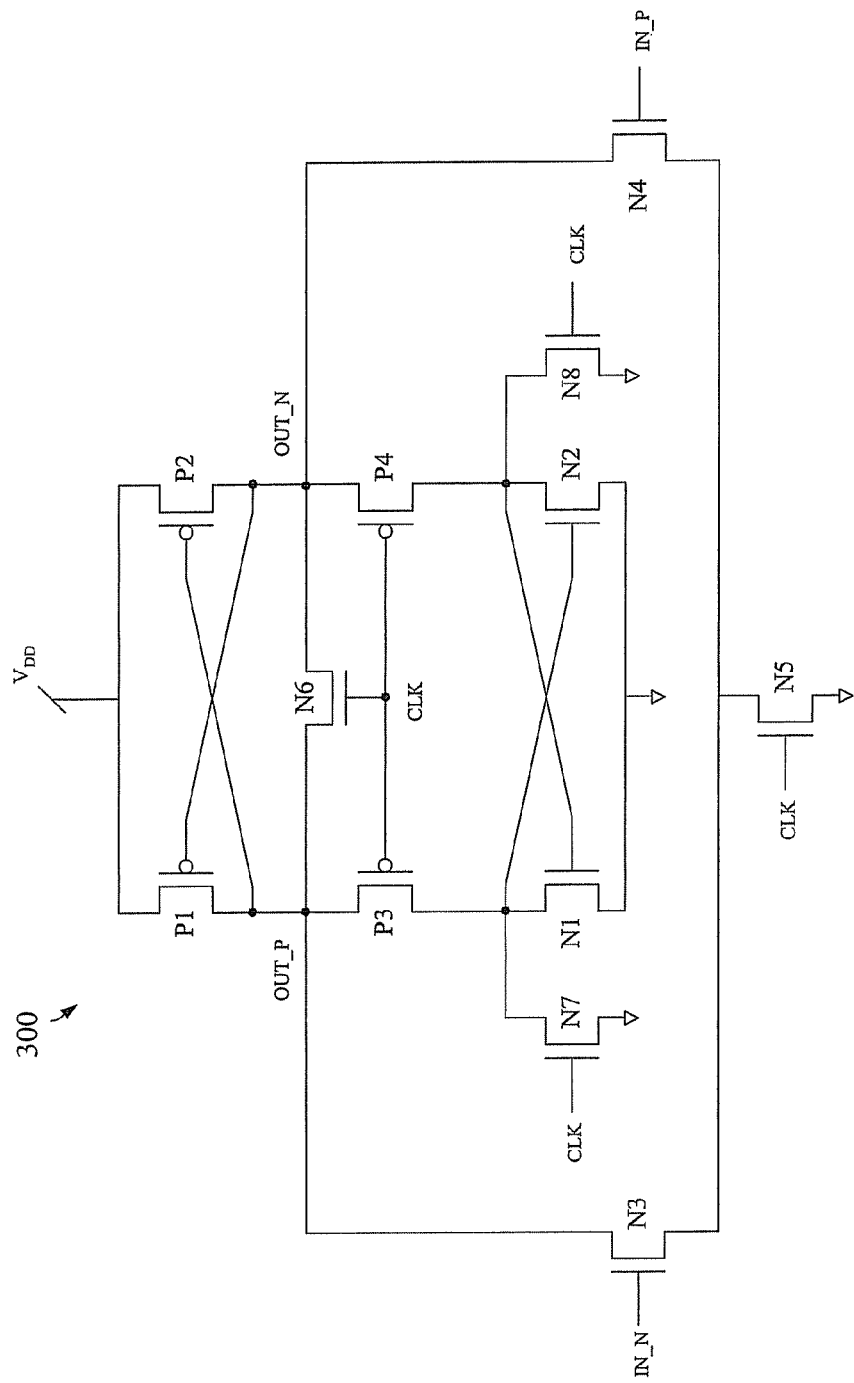
FIG. 3 a schematic diagram of a voltage comparator circuit in accordance with an embodiment of the invention.

Therefore, in accordance with an embodiment of the invention, FIG. 3 is a schematic diagram of a voltage comparator circuit 300 having improved kickback and jitter characteristics. As is shown, the circuit includes a cross-coupled inverter configuration defined by PFETs P1, P2 and NFETs N1, N2. However, in comparison to the conventional comparator 100 of FIG. 1, the control circuitry of comparator 300 is significantly different. First, it will be noted that PFETs P3 and P4 are respectively configured within the current path of the output nodes OUT_P, OUT_N, selectively isolating the pull up device (e.g., P1) from the corresponding pull down device (e.g., N1) in each inverter. In addition, an NFET N6 (as opposed to a PFET) is configured between the output nodes, and is activated during the reset phase described below. NFETs N7 and N8 are connected in parallel with pull down devices N1 and N2 respectively.

As will also be noted from FIG. 3, the NFETs N3, N4 coupled to comparator input voltages IN_N. IN_P are connected in parallel with respect to inverter NFETs N1 and N2, as is the case with control NFET N5. PFETs P3, P4 and NFETs N5, N6, N7 and N8 are each controlled by a uniphase clock signal CLK.

FIG. 4(a) schematically illustrates the comparator 300 in the reset mode of operation, during which time the clock signal CLK is at logic high. In this case, it will be noted that because PFETs P3 and P4 are switched off during reset, the NFET portions (N1, N2) of each inverter are isolated from the corresponding PFET portions (P1, P2). Any residual voltage appearing across isolated NFETs N1 and N2 are also cleared out by being shorted to ground through activation of N7 and N8 (FIG. 3). Moreover, since control NFET N5 is conductive, the input voltages IN_N and IN_P are actually coupled to the comparator output nodes OUT_P, OUT_N during the reset phase. Furthermore, since control NFET N6 is conductive, output nodes OUT_P and OUT_N are coupled to one another through a small resistance, r, which represents the slight resistance of N6 when conducting.

In other words, the combination of N3, N4, P1, P2 and r effectively creates a low gain amplifier during the reset phase of operation. Thus, a differential signal between IN_N and IN_P is actually stored in the output nodes OUT_P and OUT_N during the reset phase of operation. Subsequently, during the compare phase of operation, the developed differential seen at the output nodes OUT_P and OUT_N is immediately latched by the cross-coupled inverters, which are once again "fully connected." Moreover, the latching takes place while the inputs IN_N and IN_P are decoupled from the output nodes, thereby providing significant protection of the inputs IN_N and IN_P from kickback generated at the output nodes OUT_P and OUT_N during latching to the full rail voltages.

The equivalent circuit diagram of the comparator 300 during the compare phase is shown in FIG. 4(b). In the compare phase, CLK is low, thus deactivating NFETs N3, N4 and N5 so as to isolate the inputs IN_N and IN_P from the output nodes. In addition, N6 is deactivated while PFETs P3 and P4 are activated by the low clock signal, thereby recoupling the pull up and pull down devices of the inverters. So long as a differential signal was established at OUT_P and OUT_N during the reset phase, the inverters would not be at a metastable state (strictly speaking) upon activation of the compare phase. Thus, for example, if the voltage at OUT_P were to be slightly less than the voltage at OUT_N during reset, then OUT_P would be pulled down to ground and OUT_N would be pulled up to the rail voltage upon a transition to the compare phase shown in FIG. 4(b).

Thus configured, comparator circuit 300 offers significantly less jitter due to kickback on the output nodes, as well as improved offset characteristics. Although comparator 300 uses bias current during the static reset phase to store the input voltage differential on the output nodes (representing a tradeoff in terms of static power dissipated), the peak power dissipated is actually lower than the conventional dynamic comparator 100 of FIG. 1.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for comparing a first voltage input and a second voltage input, comprising:
   a pair of cross-coupled inverter devices, comprising a first PFET, a first NFET, a second PFET, and a second NFET;
   a pair of output nodes, defined between the first PFET and the first NFET, and between the second PFET and the second NFET of the pair of cross-coupled inverter devices;
   third and fourth NFETs connected in parallel with the first and second NFETs, respectively, of the cross-coupled inverter devices, wherein the third and fourth NFETs selectively provide parallel discharge paths for the output nodes; and
   control circuitry configured for selective switching between a reset mode and a compare mode of operation, the control circuitry further comprising third and fourth PFETs, each respectively connected between one of the output nodes and the first and second NFETs of the cross-coupled inverter devices, a fifth NFET connected between both the third and fourth NFETs and ground, a sixth NFET connected between the output nodes, and seventh and eighth NFETs respectively connected in parallel between the first and second NFETs and ground;
   wherein, during the reset mode, a differential voltage signal corresponding to a voltage differential between the first and second voltage inputs is coupled to the pair of output nodes by applying the first and second voltage inputs to the third and fourth NFETs, and the first and second NFETs of the cross-coupled inverter devices are isolated from the first and second PFETs of the cross-coupled inverter devices so as to store the differential signal across the output nodes; and
   wherein, during the compare mode, the third and fourth NFETs are isolated from providing the parallel discharge paths for the output nodes, and the first and second NFETs of the cross-coupled inverter devices are recoupled to the first and second PFETs so as to so as to allow latching of the stored differential signal across the output nodes to a corresponding full rail value.

2. The apparatus of claim 1, wherein each of the control circuitry devices are controlled by a uniphase clock signal.

* * * * *